United States Patent
Ku et al.

(10) Patent No.: US 11,361,824 B1
(45) Date of Patent: Jun. 14, 2022

(54) MEMORY DEVICE AND OPERATION METHOD THEREOF

(71) Applicant: MACRONIX INTERNATIONAL CO., LTD., Hsinchu (TW)

(72) Inventors: Shaw-Hung Ku, Hsinchu (TW); Cheng-Hsien Cheng, Yunlin County (TW); Chun-Chang Lu, Yunlin County (TW); Wen-Jer Tsai, Hualien (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/164,976

(22) Filed: Feb. 2, 2021

(51) Int. Cl.
| | |
|---|---|
| *G11C 16/16* | (2006.01) |
| *G11C 16/08* | (2006.01) |
| *G11C 16/14* | (2006.01) |
| *G11C 16/34* | (2006.01) |
| *G11C 16/30* | (2006.01) |
| *G11C 16/26* | (2006.01) |

(52) U.S. Cl.
CPC .............. *G11C 16/08* (2013.01); *G11C 16/14* (2013.01); *G11C 16/26* (2013.01); *G11C 16/30* (2013.01); *G11C 16/3404* (2013.01)

(58) Field of Classification Search
CPC ......... G11C 16/08; G11C 16/14; G11C 16/26; G11C 16/30; G11C 16/3404
See application file for complete search history.

(56) References Cited

U.S. PATENT DOCUMENTS

| | | | |
|---|---|---|---|
| 8,848,426 B2 | 9/2014 | Azuma et al. | |
| 10,832,785 B2 | 11/2020 | Zhao et al. | |
| 10,839,901 B1 | 11/2020 | Lee et al. | |
| 10,854,296 B2 | 12/2020 | Seo et al. | |
| 2018/0225164 A1* | 8/2018 | Khoueir | G06F 11/1072 |
| 2021/0020256 A1 | 1/2021 | Kim et al. | |

\* cited by examiner

*Primary Examiner* — Xiaochun L Chen
(74) *Attorney, Agent, or Firm* — McClure, Qualey & Rodack, LLP

(57) ABSTRACT

Provided are a memory device and an operation method thereof. The memory device includes a plurality of word lines. The operation method comprising: performing a pre-fill operation on the word lines, in a first loop, applying a selected word line voltage on a first selected word line group and applying an unselected word line voltage on a first unselected word line group, and in a second loop, applying the selected word line voltage on a second selected word line group and applying the unselected word line voltage on a second unselected word line group, the first selected word line group being different from the second selected word line group, and the first unselected word line group being different from the second unselected word line group; performing an erase operation on the word lines; and performing a programming operation on the word lines.

20 Claims, 16 Drawing Sheets

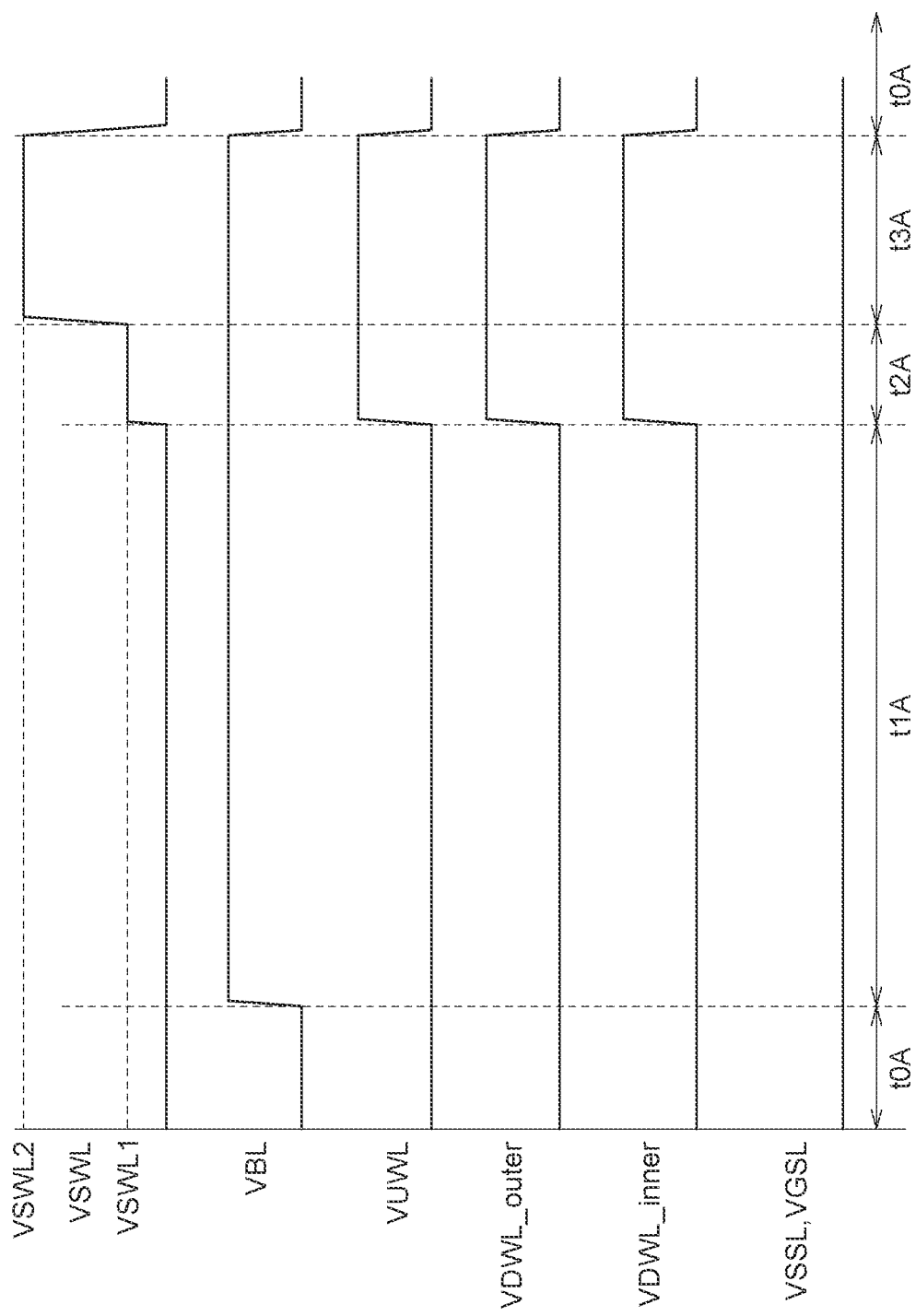

MEMORY DEVICE AND OPERATION METHOD THEREOF

TECHNICAL FIELD

The disclosure relates in general to a memory device and an operation method thereof.

BACKGROUND

For now, volume demand for memory storage is higher. Triple-level cells (TLC), quad-level cells (QLC) and penta-level cells (QLC) are developed for increasing memory storage density.

However, in programming, program charges would spread vertically as well as laterally, especially in high threshold voltage (Vt) level. In short term (in millisecond domain), lower bound Vt spreading induced by fast charge lateral movement should be controllable. In long term (longer than milliseconds), retention charge loss caused by fast charge lateral movement should be suppressed.

SUMMARY

The disclosure is directed to a memory device and an operation method thereof for suppressing Vt spreading and retention charge loss caused by fast charge lateral movement.

According to one embodiment, provided is an operation method of a memory device including a plurality of word lines, the operation method comprising: performing a pre-fill operation on the word lines, in a first loop, applying a selected word line voltage on a first selected word line group of the word lines and applying an unselected word line voltage on a first unselected word line group of the word lines, and in a second loop, applying the selected word line voltage on a second selected word line group of the word lines and applying the unselected word line voltage on a second unselected word line group of the word lines, the first selected word line group being different from the second selected word line group, and the first unselected word line group being different from the second unselected word line group; performing an erase operation on the word lines; and performing a programming operation on the word lines.

According to another embodiment, provided is a memory device including: a controller; and a memory array coupled to the controller, the memory array including a plurality of word lines, wherein the controller is configured for: performing a pre-fill operation on the word lines, in a first loop, applying a selected word line voltage on a first selected word line group of the word lines and applying an unselected word line voltage on a first unselected word line group of the word lines, and in a second loop, applying the selected word line voltage on a second selected word line group of the word lines and applying the unselected word line voltage on a second unselected word line group of the word lines, the first selected word line group being different from the second selected word line group, and the first unselected word line group being different from the second unselected word line group; performing an erase operation on the word lines; and performing a programming operation on the word lines.

BRIEF DESCRIPTION OF THE DRAWINGS

FIG. 3A shows a voltage waveform according to one embodiment of the application.

Figure 1A:
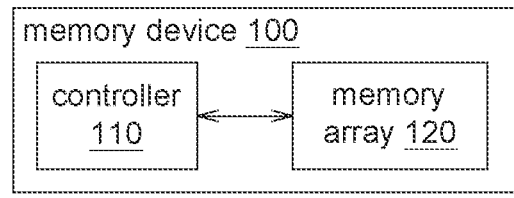
FIG. 1A shows a functional block diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1A shows a functional block diagram of a memory device 100 according to one embodiment of the application. The memory device 100 includes a controller 110 and a memory array 120. The controller 110 is coupled to the memory array 120. The controller 110 controls operations of the memory array 120, for example but not limited by, a pre-filling operation, an erase operation and a programming operation.

Figure 1B:
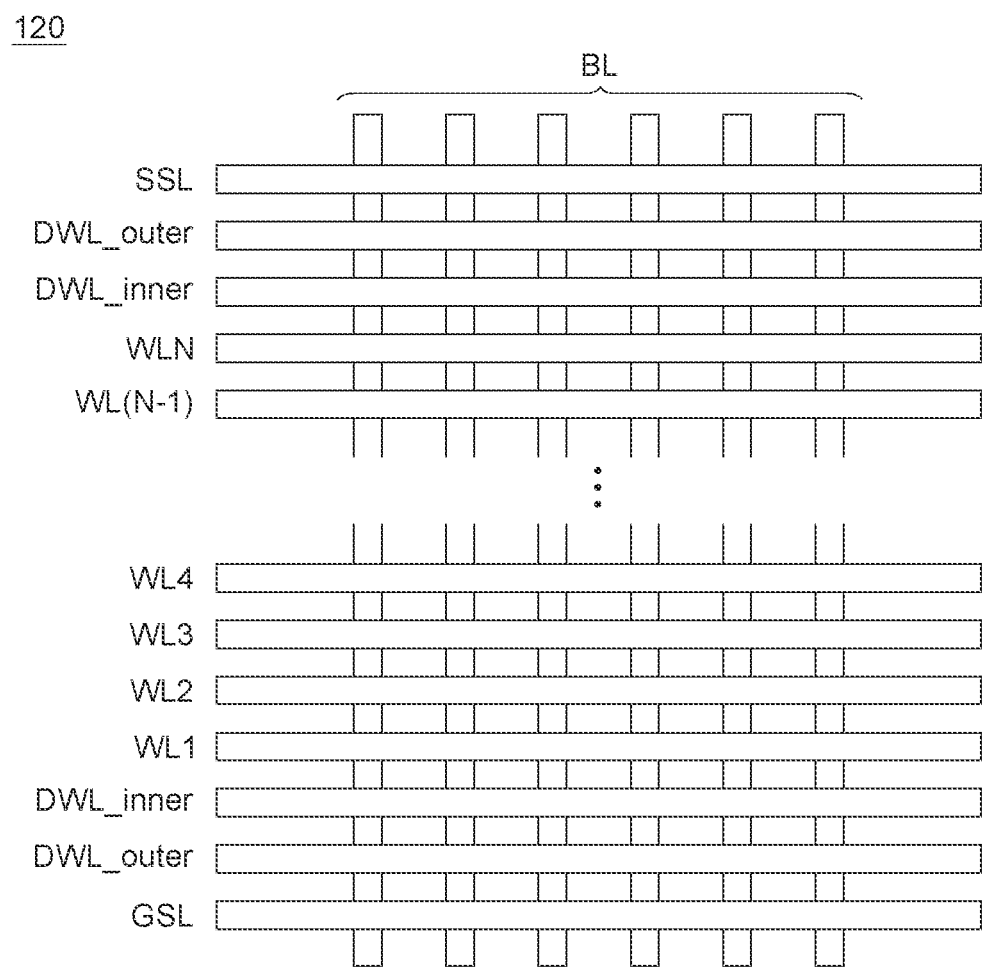
FIG. 1B shows a structure diagram of the memory array 120 according to one embodiment of the application.

FIG. 1B shows a structure diagram of the memory array 120 according to one embodiment of the application. The memory array 120 includes: a plurality of bit lines BL, a string select line SSL, a global select line GSL, a plurality of inner dummy word lines DWL_inner, a plurality of outer dummy word lines DWL_outer and a plurality of word lines WL1 to WLN (N being a positive integer).

Figure 2:
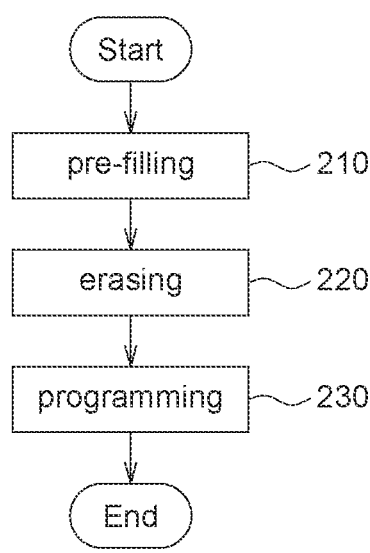
FIG. 2 shows a flow chart of an operation method according to one embodiment of the application.

FIG. 2 shows a flow chart of an operation method according to one embodiment of the application. In step 210, a pre-filling operation is performed. In step 220, an erase operation is performed. In step 230, a programming operation is performed. In one possible embodiment of the application, details of the erase operation and the programming operation are not specified. Details of the pre-filling operation are explained below.

Figure 3B:
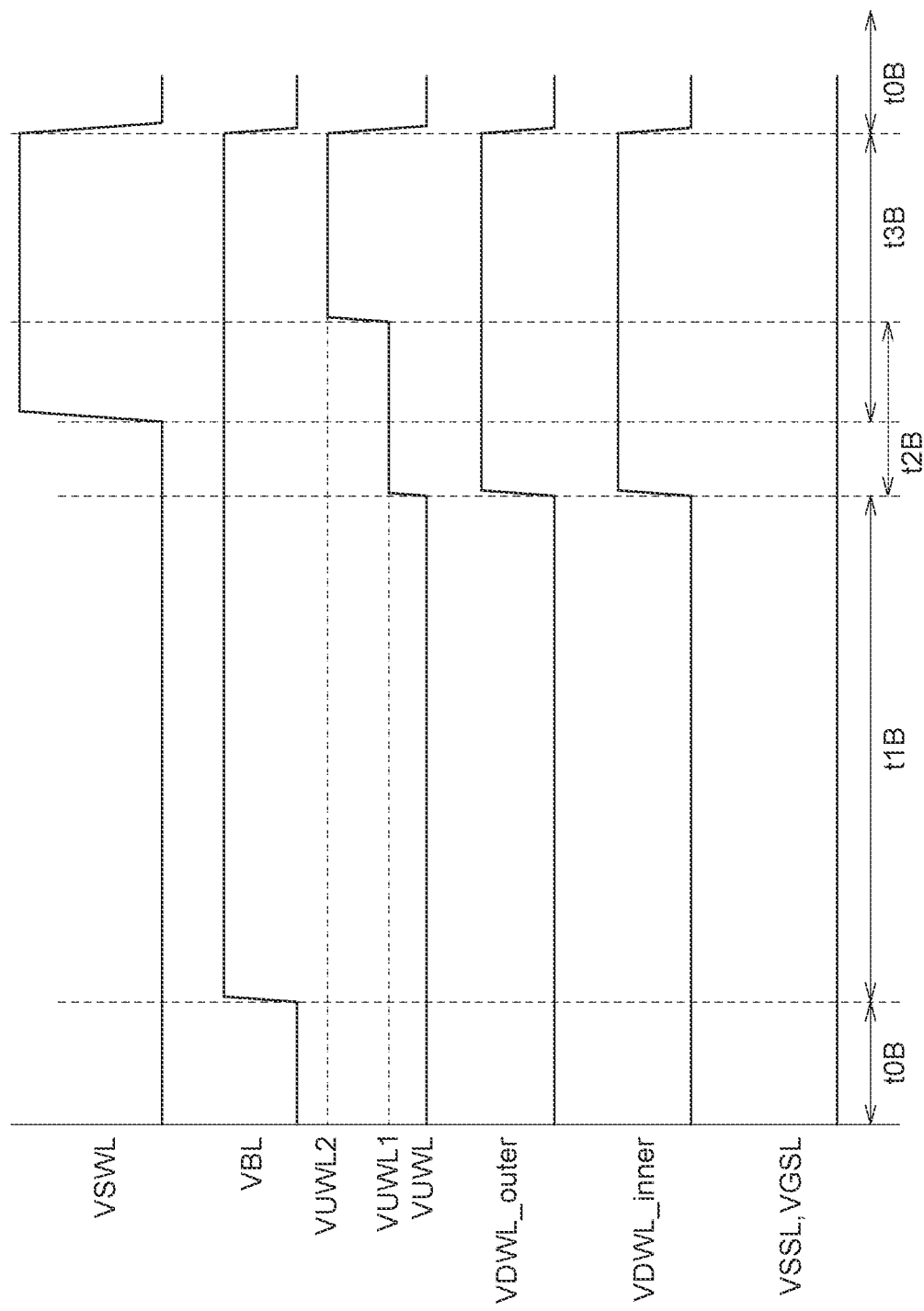
FIG. 3B shows a voltage waveform according to another embodiment of the application.

FIG. 3A shows a voltage waveform according to one embodiment of the application. FIG. 3B shows a voltage waveform according to another embodiment of the application. In FIG. 3A and FIG. 3B, VSWL refers to a selected word line voltage which is applied to at least one selected word line, VBL refers to a bit line voltage which is applied to at least one bit line BL, VUWL refers to an unselected word line voltage which is applied to at least one unselected word line, VDWL_outer refers to an outer dummy word line voltage which is applied to the outer dummy word lines DWL_outer, VDWL_inner refers to an inner dummy word line voltage which is applied to the inner dummy word lines DWL_inner, VSSL refers to a string select line voltage which is applied to the string select line SSL, and VGSL refers to a global select line voltage which is applied to the global select line GSL.

In one embodiment of the application, each pre-fill operation loop includes four phases: an off phase (t0A and t0B), a first pre-on phase (t1A and t1B), a second pre-on phase (t2A and t2B) and a pre-filling phase (t3A and t3B).

Now refer to FIG. 3A.

In the off phase t0A, all voltages are logic low level (for example but not limited by, 0V).

In the first pre-on phase t1A, the bit line voltage VBL is transited to logic high level to pre-on the bit lines BL. The selected word line voltage VSWL, the unselected word line voltage VUWL, the outer dummy word line voltage VDWL_outer, the inner dummy word line voltage VDWL_inner, the string select line voltage VSSL, and the global select line voltage VGSL are all kept at logic low level. Thus, the first pre-on phase t1A is also referred as a bit line pre-on phase for pre-turning on the bit lines BL.

In the second pre-on phase t2A, the selected word line voltage VSWL is transited to a first selected word line voltage VSWL1; the bit line voltage VBL is kept at logic high level; the unselected word line voltage VUWL is transited to logic high level; the outer dummy word line voltage VDWL_outer is transited to logic high level; the inner dummy word line voltage VDWL_inner is transited to logic high level; and the string select line voltage VSSL, and the global select line voltage VGSL are kept at logic low level. Thus, the second pre-on phase t2A is also referred as an unselected word line pre-on phase for pre-turning on the unselected word lines.

In the pre-fill phase t3A, the selected word line voltage VSWL is raised from the first selected word line voltage VSWL1 to a second selected word line voltage VSWL2 (for example but not limited by, the second selected word line voltage VSWL2 is equal to Vgpgm); the bit line voltage VBL is kept at logic high level; the unselected word line voltage VUWL is kept at logic high level; the outer dummy word line voltage VDWL_outer is kept at logic high level; the inner dummy word line voltage VDWL_inner is kept at logic high level; and the string select line voltage VSSL and the global select line voltage VGSL are kept at logic low level.

In one possible embodiment of the application, as for FIG. 3A, the logic high level of the bit line voltage VBL is for example but not limited by, a power VCC level or higher, VCC having an example value of 1.2V~3.3V, and thus, the logic high level of the bit line voltage VBL may be between 1V~4V. The first selected word line voltage VSWL1 is higher than 0V but lower than the second selected word line voltage VSWL2 (0V<VSWL1<VSWL2). The second selected word line voltage VSWL2 is a programming voltage (which is usually between 15V~25V). The logic high level of the unselected word line voltage VUWL is about a difference value between the programming voltage and a first predetermined voltage (for example 15V), and thus the logic high level of the unselected word line voltage VUWL is about 0V~10V. The logic high level of the inner dummy word line voltage VDWL_inner is higher than or equal to a summation value of a highest threshold voltage (Vt) (which is usually 5V~6V) and a second predetermined value (for example but not limited by, 1.5V), and thus the logic high level of the inner dummy word line voltage VDWL_inner is higher than or equal to 6.5V. The logic high level of the outer dummy word line voltage VDWL_outer is lower than a difference value between the logic high level of the inner dummy word line voltage VDWL_inner and a third predetermined value (for example but not limited by, 2V) and thus the logic high level of the outer dummy word line voltage VDWL_outer is lower than 4.5V (for example between 2V~4.5V).

Now refer to FIG. 3B. Basically, the off phase t0B and the first pre-on phase t1B are the same or similar to the off phase t0A and the first pre-on phase t1A, and thus the details are omitted here.

In the second pre-on phase t2B, the selected word line voltage VSWL is kept at logic low level; the bit line voltage VBL is kept at logic high level: the unselected word line voltage VUWL is transited to a first unselected word line voltage VUWL1; the outer dummy word line voltage VDWL_outer is transited to logic high level; the inner dummy word line voltage VDWL_inner is transited to logic high level: and the string select line voltage VSSL, and the global select line voltage VGSL are kept at logic low level. Thus, the second pre-on phase t2B is also referred as an unselected word line pre-on phase.

In the pre-fill phase t3B, the selected word line voltage VSWL is transited to logic high level; the bit line voltage VBL is kept at logic high level; the unselected word line voltage VUWL is raised from the first unselected word line voltage VUWL1 to a second unselected word line voltage VUWL2; the outer dummy word line voltage VDWL_outer is kept at logic high level: the inner dummy word line voltage VDWL_inner is kept at logic high level; and the string select line voltage VSSL and the global select line voltage VGSL are kept at logic low level. The second pre-on phase t2B and the pre-filling phase t3B are partially overlapped.

In one possible embodiment of the application, as for FIG. 3B, the bit line voltage VBL, the outer dummy word line voltage VDWL_outer and the inner dummy word line voltage VDWL_inner have the same logic high level as that in FIG. 3A. Further, in FIG. 3B, the logic high level of the selected word line voltage VSWL is equal to the programming voltage Vgpgm (which is usually between 15V~25V). The first unselected word line voltage VUWL1 is higher than 0V but lower than the second unselected word line voltage VUWL2 (0V<VUWL1<VUWL2). The second unselected word line voltage VUWL2 is about the difference value between the programming voltage Vgpgm and the first predetermined value (for example 15V), and thus the second unselected word line voltage VUWL2 is about 0V~10V.

Details of the pre-filling operations according to one embodiment of the application are described. In each pre-fill operation loop, one or more target word lines among the word lines WL1 to WLN are selected as the selected word line group while the other word lines are as the unselected word line group. Thus, the selected word line voltage VSWL is applied to the selected word line group while the unselected word line voltage VUWL is applied to the unselected word line group.

Now, how to select the selected word line group and the unselected word line group are described.

First Embodiment

In the first embodiment of the application, the word lines WL1 to WLN are divided as an "odd word line group" and an "even word line group". That is, in the first embodiment of the application, the "odd word line group" includes word lines WL1, WL3, . . . , WL(N−1) while the "even word line group" includes the word lines WL2, WL4, . . . , WLN (when N is a positive even integer).

Figure 4A:
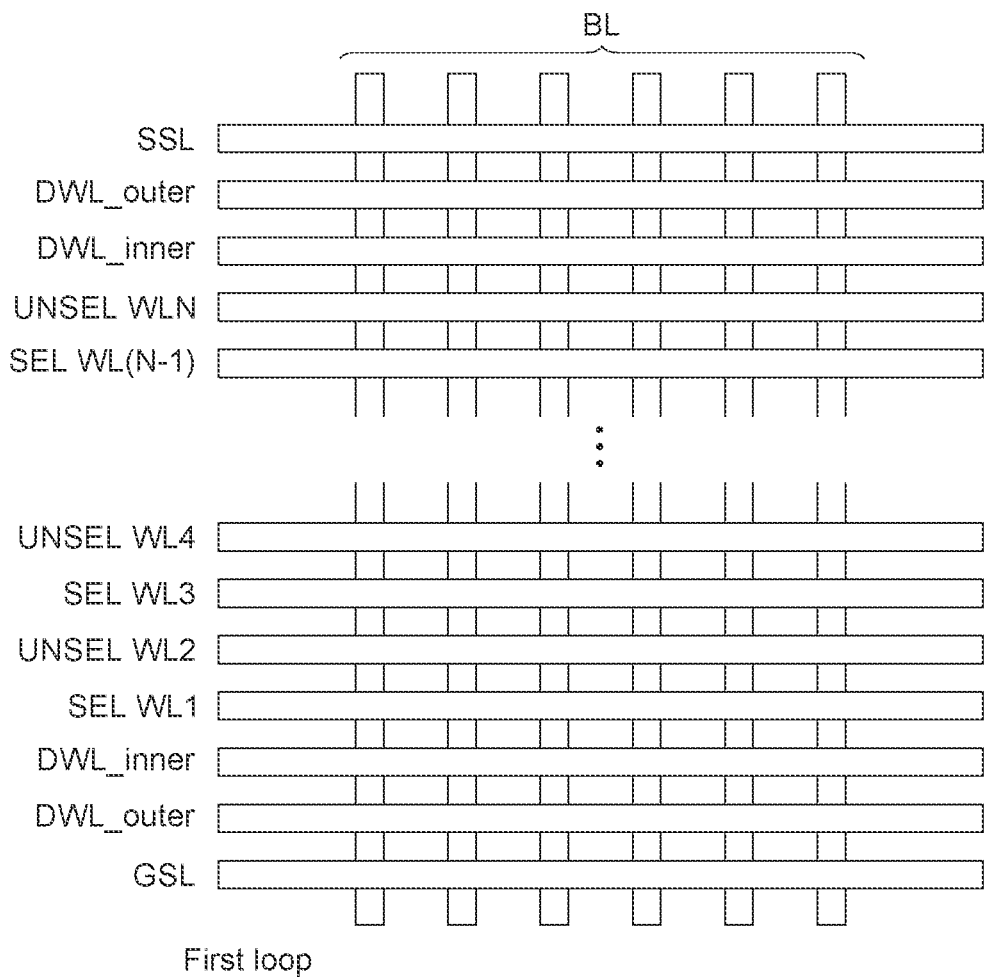
FIG. 4A and FIG. 4B show pre-fill operation loops according to the first embodiment of the application.
Figure 4B:
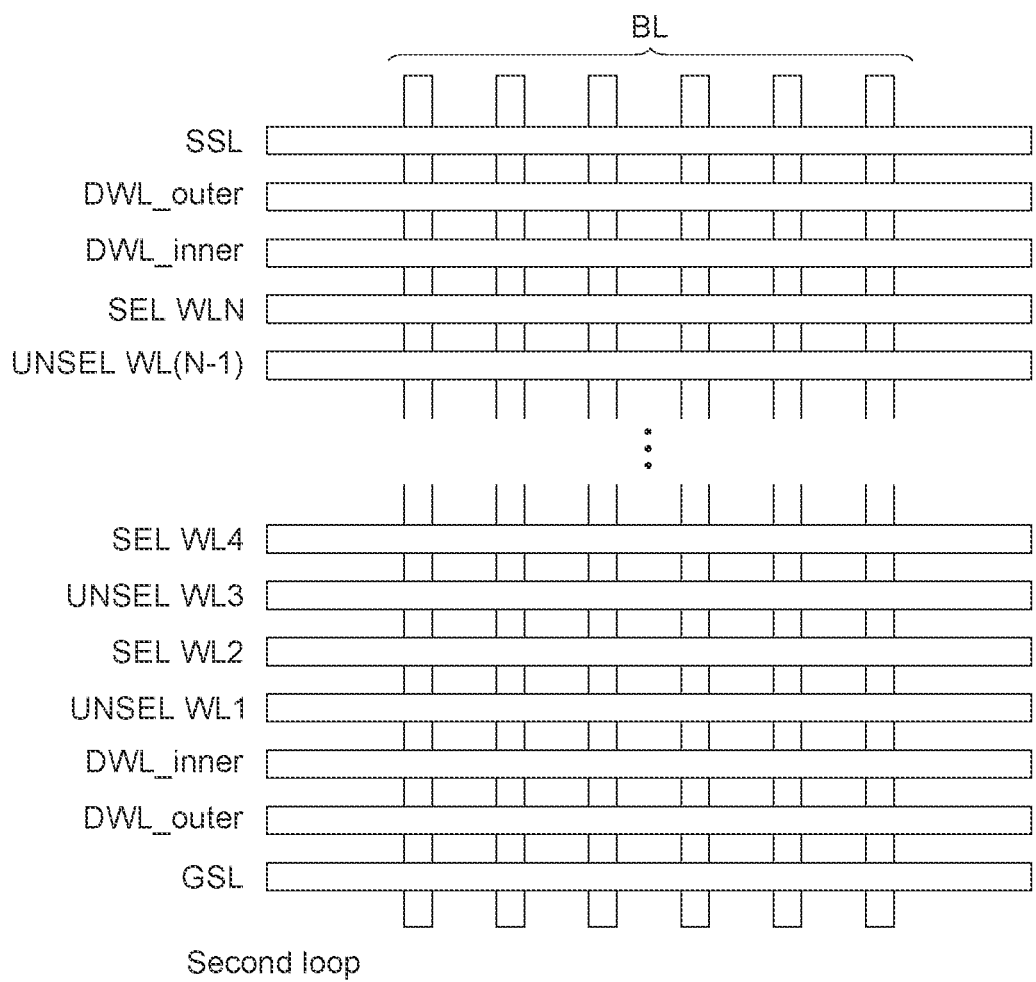

FIG. 4A and FIG. 4B show pre-fill operation loops according to the first embodiment of the application. For simplicity, in the first pre-fill operation loop, the "odd word line group" is selected as the selected word line group while the "even word line group" is selected as the unselected word line group, as shown in FIG. 4A. In the second pre-fill operation loop, the "even word line group" is selected as the selected word line group while the "odd word line group" is selected as the unselected word line group, as shown in FIG. 4B. The application is not limited by this.

That is, in the first embodiment, in the first pre-fill operation loop, the selected word line voltage VSWL (as shown in FIG. 3A or FIG. 3B) is applied to the odd word line group (including the word lines WL1, WL3, . . . ) while the unselected word line voltage VUWL (as shown in FIG. 3A or FIG. 3B) is applied to the even word line group (including the word lines WL2, WL4, . . . ). In the second pre-fill operation loop, the selected word line voltage VSWL (as shown in FIG. 3A or FIG. 3B) is applied to the even word line group (including the word lines WL2, WL4, . . . ) while the unselected word line voltage VUWL (as shown in FIG. 3A or FIG. 3B) is applied to the odd word line group (including the word lines WL1, WL3, . . . ).

Of course, the application is not limited by this. In a possible variation example of the first embodiment, in the first pre-fill operation loop, the "even word line group" is selected as the selected word line group while the "odd word line group" is selected as the unselected word line group. In the second pre-fill operation loop, the "odd word line group" is selected as the selected word line group while the "even word line group" is selected as the unselected word line group. This is still within the spirit and the scope of the application.

As described, in the first embodiment, two loops are needed for completing the pre-filling operation.

Second Embodiment

In the second embodiment of the application, the word lines WL1 to WLN are divided as "a first word line group" and "a second word line group". The first word line group includes a plurality of first word line sub-groups each including adjacent continuous "i" (i being a positive integer) word line(s); and the second word line group includes a plurality of second word line sub-groups each including adjacent continuous "j" (j being a positive integer) word line(s). The first word line sub-groups and the second word line sub-groups are interleaving to each other.

In the second embodiment, in the first pre-fill operation loop, the selected word line voltage VSWL is applied to the first word line group while the unselected word line voltage VUWL is applied to the second word line group. In the second pre-fill operation loop, the selected word line voltage VSWL is applied to the second word line group while the unselected word line voltage VUWL is applied to the first word line group. Of course, the application is not limited by this.

For understanding, several examples are used to explain the second embodiment.

Figure 5A:
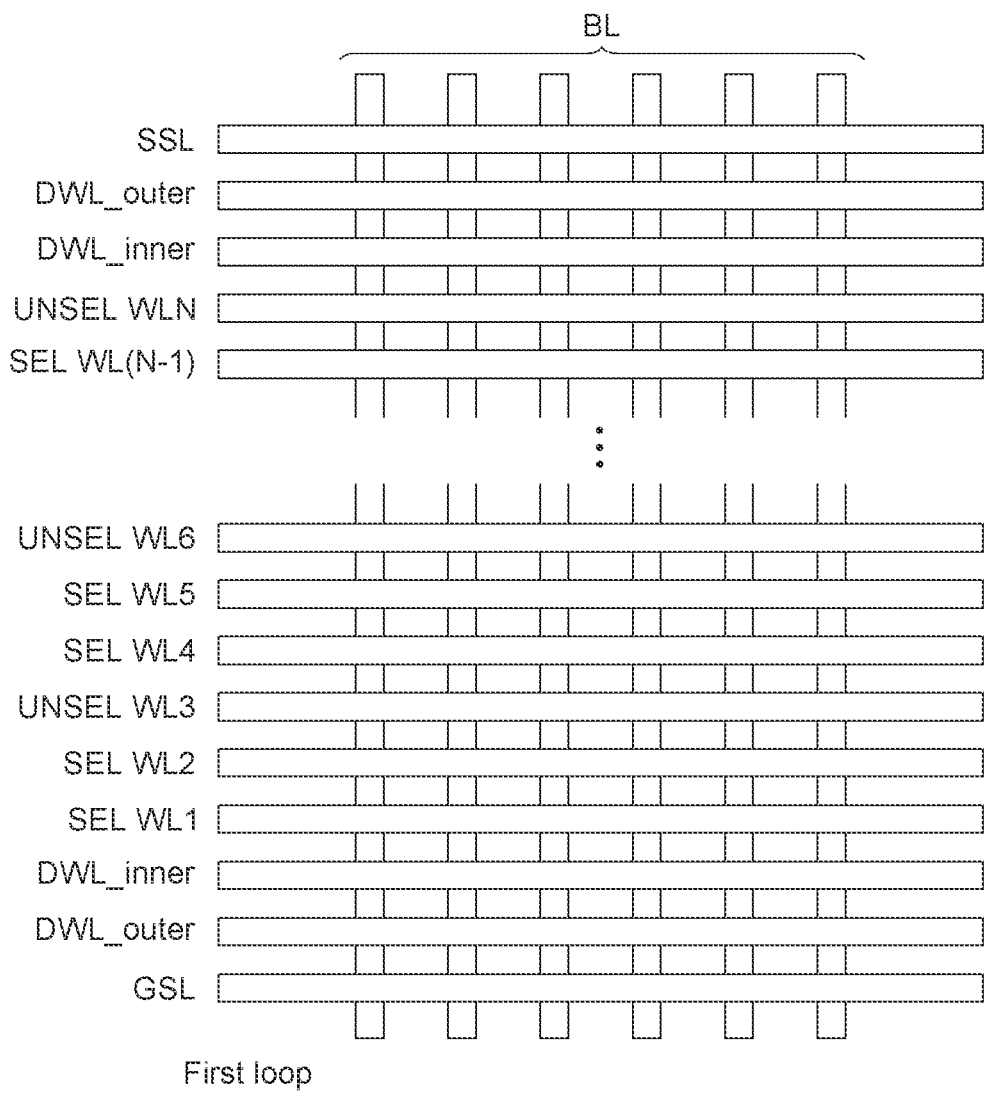
FIG. 5A and FIG. 5B show pre-fill operation loops according to the second embodiment of the application.
Figure 5B:
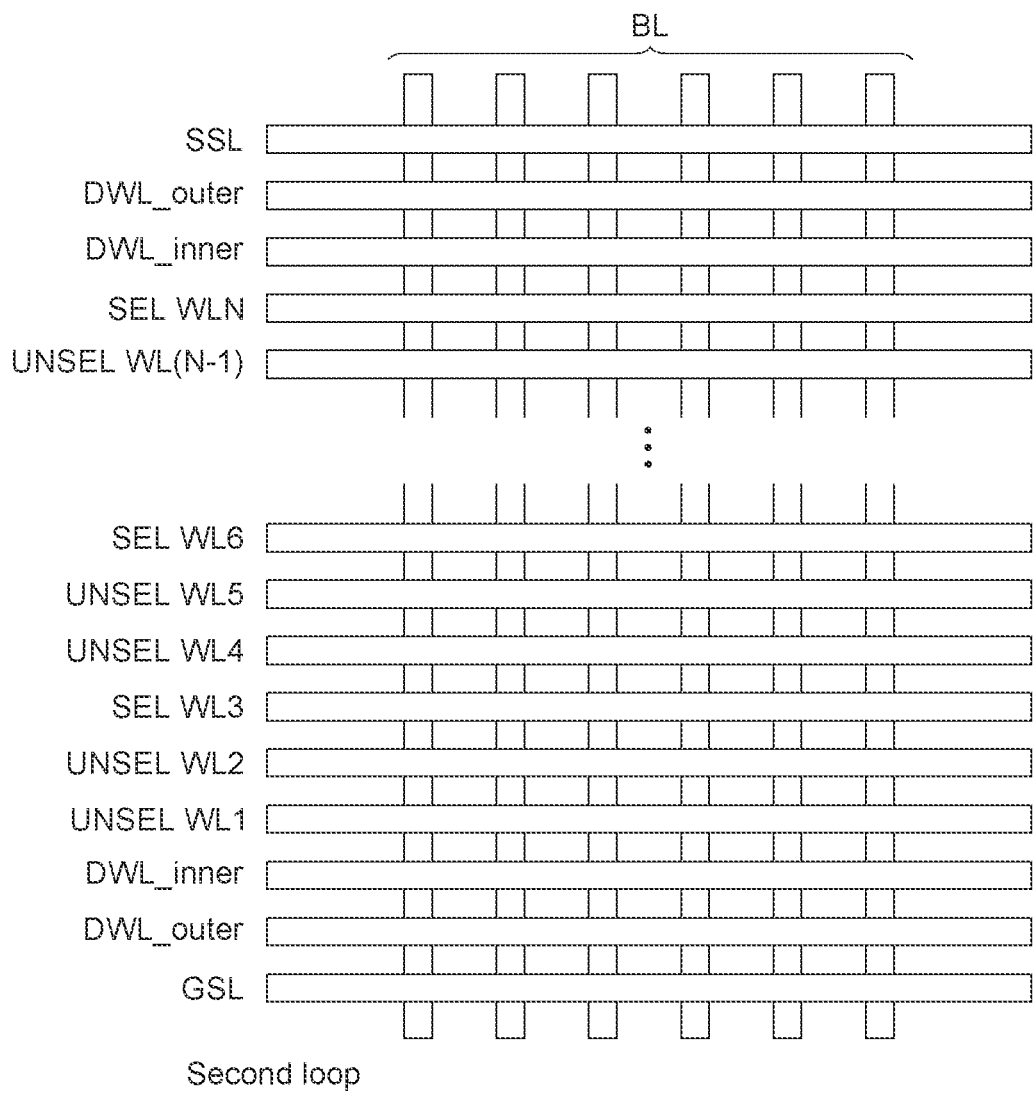
Figure 6A:
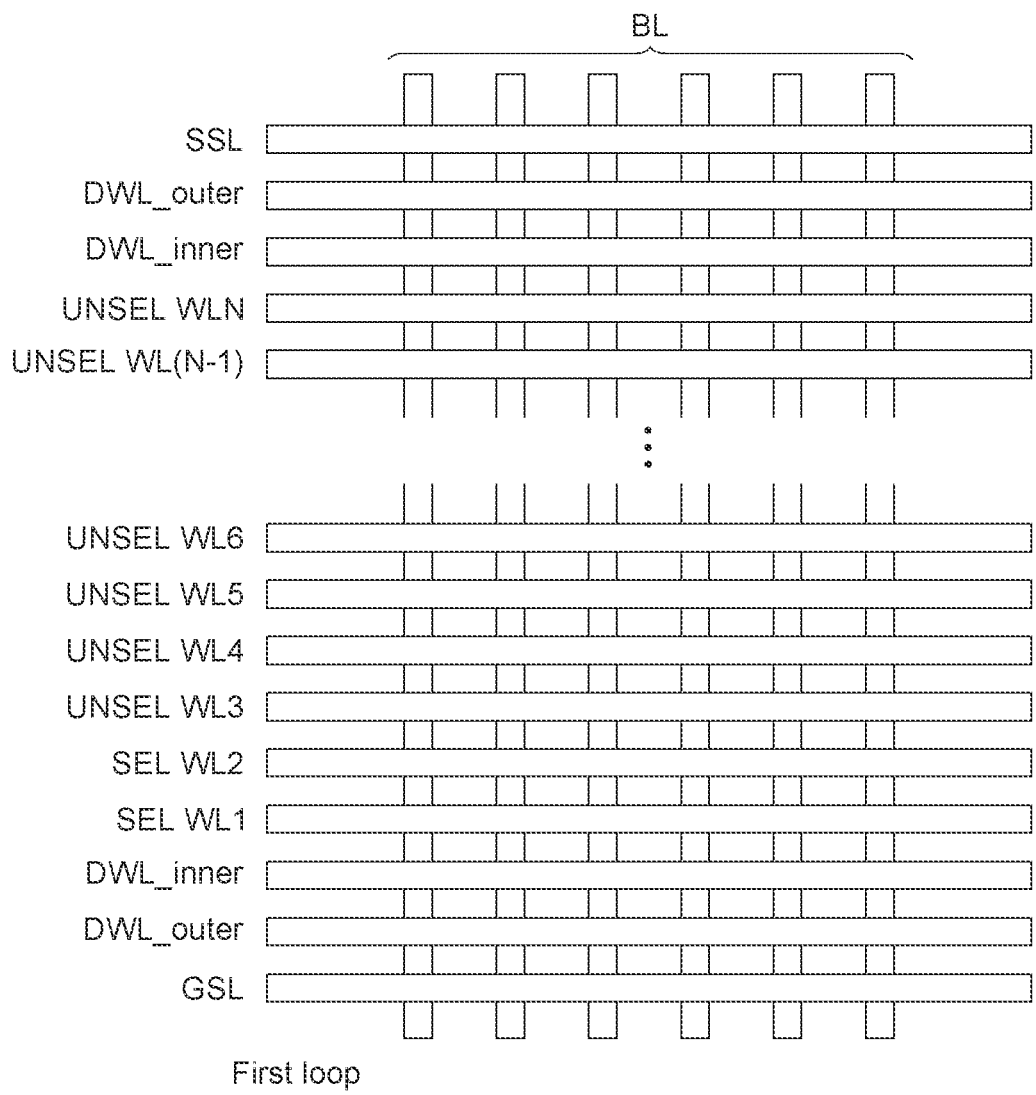
FIG. 6A to FIG. 6D show pre-fill operation loops according to the third embodiment of the application.
Figure 6B:
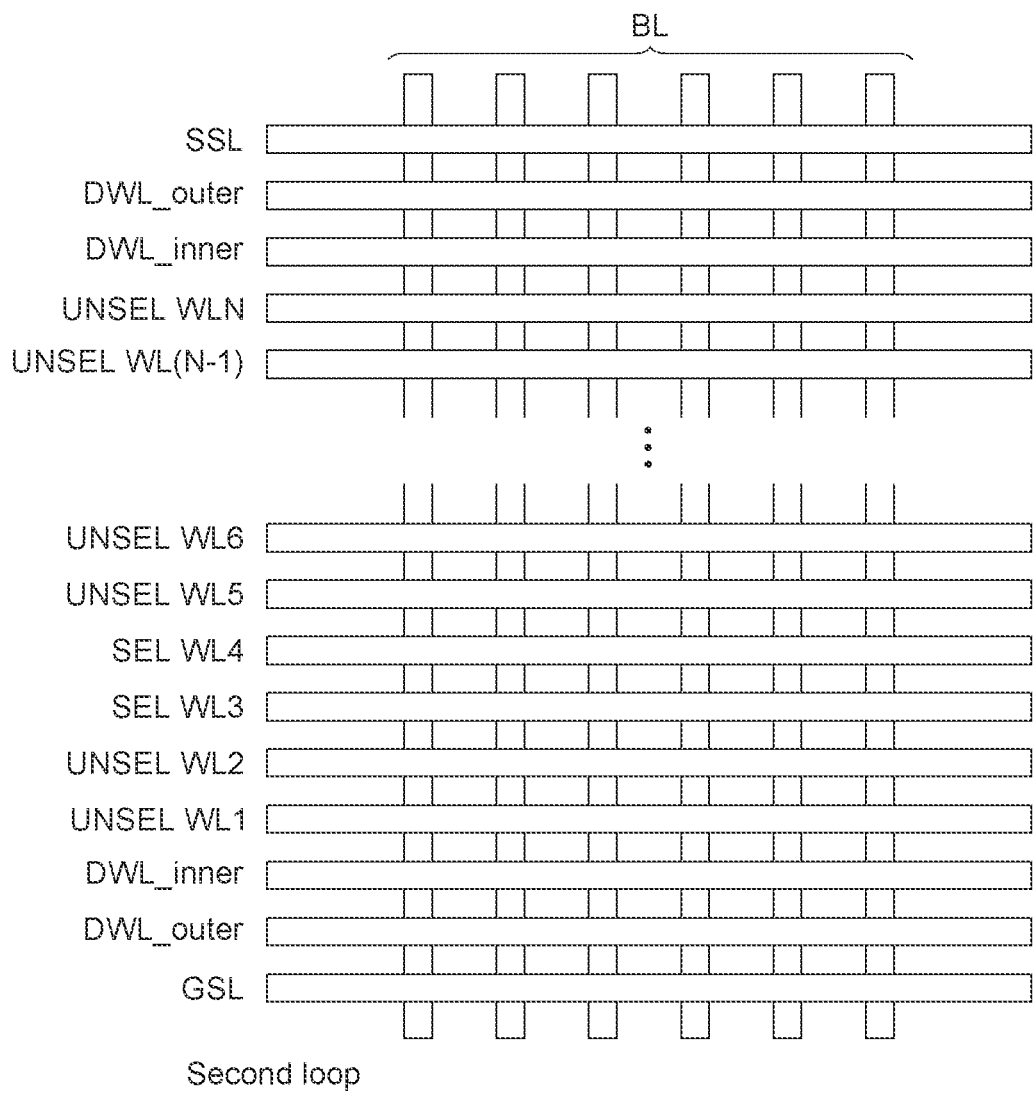
Figure 6C:
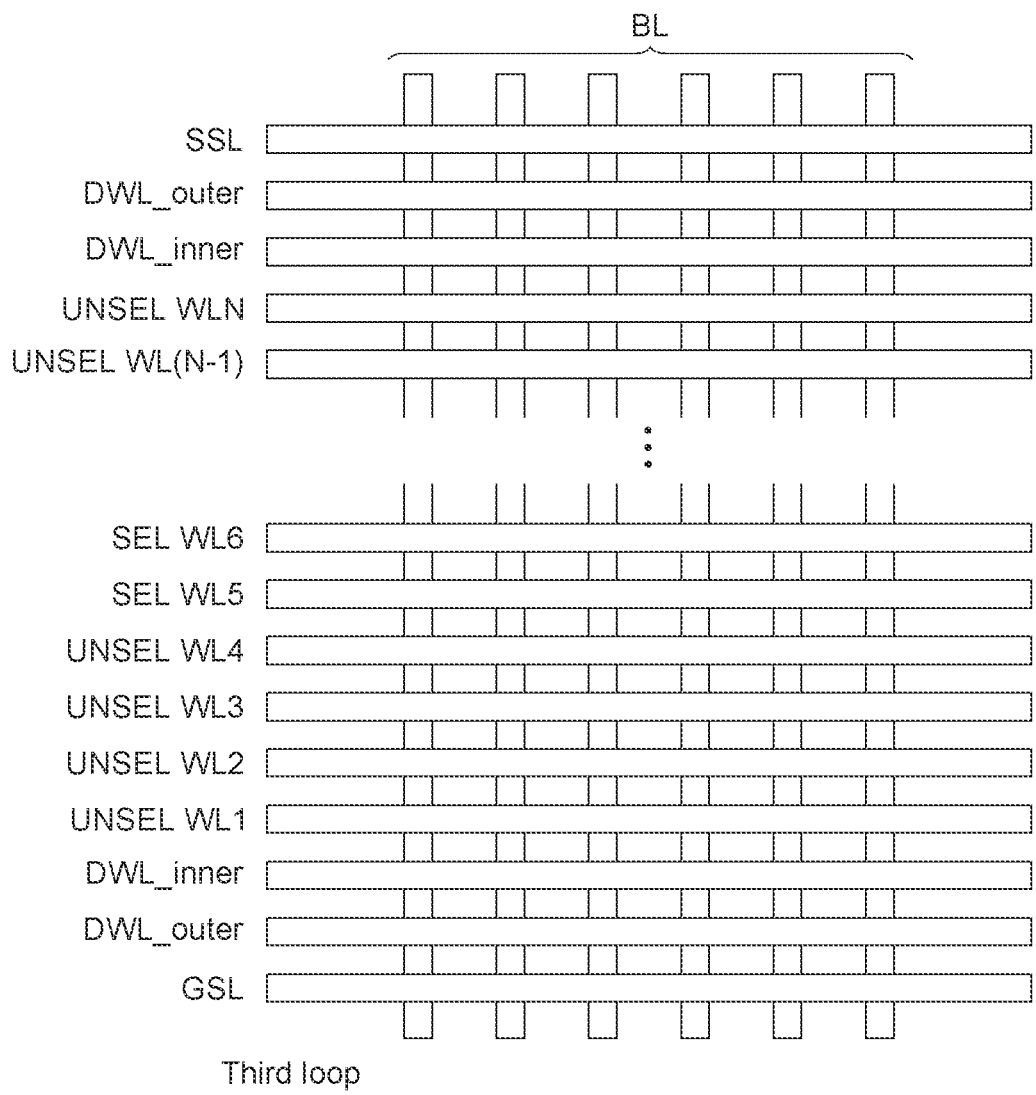
Figure 6D:
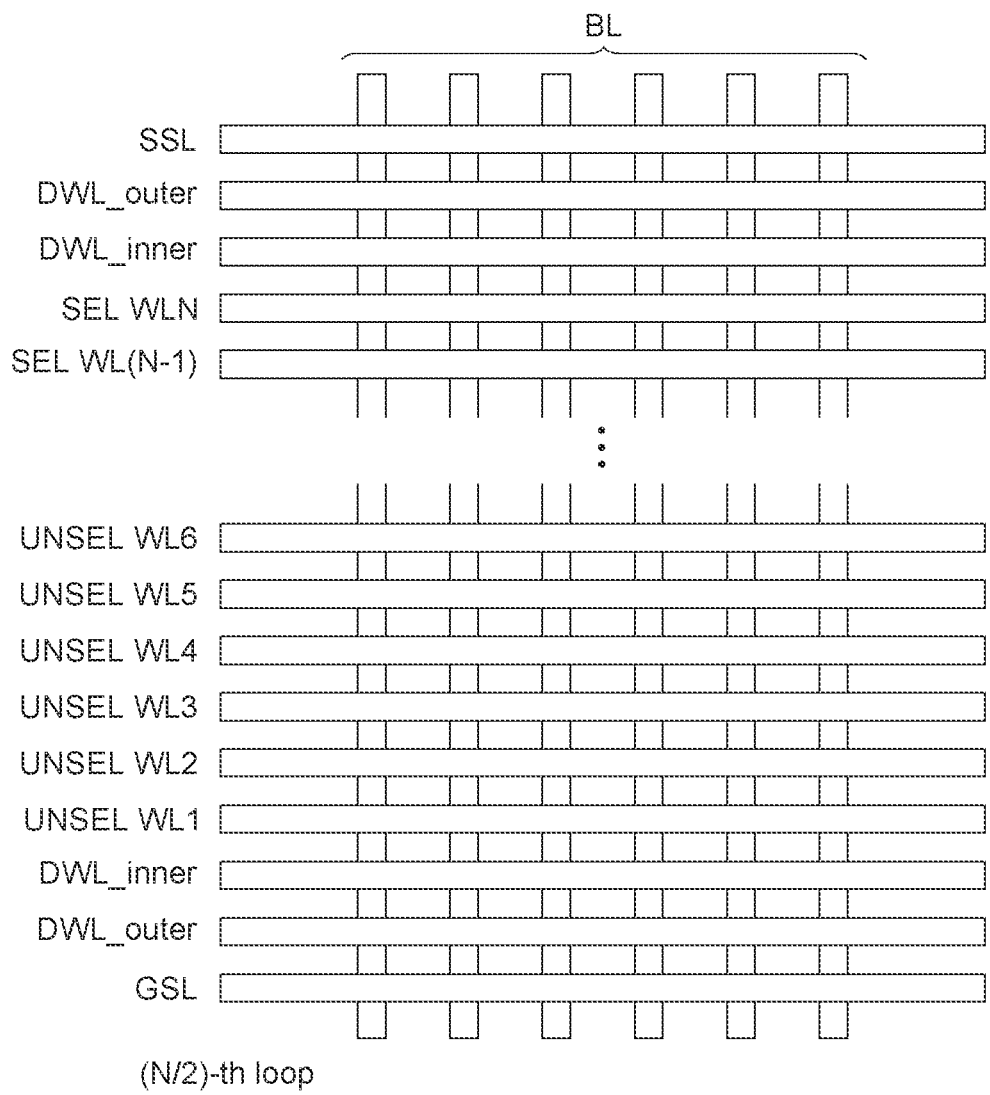

FIG. 5A and FIG. 5B show pre-fill operation loops according to the second embodiment of the application. Now refer to FIG. 5A and FIG. 5B. The case that i=2 and j=1 is taken as an example. Among the word lines WL1 to WLN, the word lines WL1 and WL2 are in one of the first word line sub-groups of the first word line group; the word line WL3 is in one of the second word line sub-groups of the second word line group; the word lines WL4 and WL5 are in one of the first word line sub-groups of the first word line group: the word line WL6 is in one of the second word line sub-groups of the second word line group: and so on. Thus, in the first pre-fill operation loop, the selected word line voltage VSWL (as shown in FIG. 3A and FIG. 3B) is applied to the first word line group (the word lines WL1, WL2, WL4, WL5, . . . ) while the unselected word line voltage VUWL (as shown in FIG. 3A and FIG. 3B) is applied to the second word line group (the word lines WL3, WL6, . . . ), as shown in FIG. 5A. In the second pre-fill operation loop, the selected word line voltage VSWL (as shown in FIG. 3A and FIG. 3B) is applied to the second word line group (the word lines WL3, WL6, . . . ) while the unselected word line voltage VUWL (as shown in FIG. 3A and FIG. 3B) is applied to the first word line group (the word lines WL1, WL2, WL4, WL5, . . . ), as shown in FIG. 5B. Of course, the application is not limited by this.

Alternatively, in the second embodiment, the case that i=2 and j=2 is taken as an example. Among the word lines WL1 to WLN, the word lines WL1 and WL2 are in one of the first word line sub-groups of the first word line group: the word lines WL3 and WL4 are in one of the second word line sub-groups of the second word line group; the word lines WL5 and WL6 are in one of the first word line sub-groups of the first word line group: the word lines WL7 and WL8 are in one of the second word line sub-groups of the second word line group; and so on. Thus, in the first pre-fill operation loop, the selected word line voltage VSWL (as shown in FIG. 3A and FIG. 3B) is applied to the first word line group (the word lines WL1, WL2, WL5, WL6, . . . ) while the unselected word line voltage VUWL (as shown in FIG. 3A and FIG. 3B) is applied to the second word line group (the word lines WL3, WL4, WL7, WL8, . . . ). In the second pre-fill operation loop, the selected word line voltage VSWL (as shown in FIG. 3A and FIG. 3B) is applied to the second word line group (the word lines WL3, WL4, WL7, WL8, . . . ) while the unselected word line voltage VUWL (as shown in FIG. 3A and FIG. 3B) is applied to the first word line group (the word lines WL1, WL2, WL5, WL6, . . . ). Of course, the application is not limited by this.

Alternatively, in the second embodiment, the case that i=3 and j=1 is taken as an example. Among the word lines WL1 to WLN, the word lines WL1 to WL3 are in one of the first word line sub-groups of the first word line group; the word line WL4 is in one of the second word line sub-groups of the second word line group; the word lines WL5 to WL7 are in one of the first word line sub-groups of the first word line group; the word line WL8 is in one of the second word line sub-groups of the second word line group; and so on. Thus, in the first pre-fill operation loop, the selected word line voltage VSWL (as shown in FIG. 3A and FIG. 3B) is applied to the first word line group (the word lines WL1 to WL3, WL5 to WL7, . . . ) while the unselected word line voltage VUWL (as shown in FIG. 3A and FIG. 3B) is applied to the second word line group (the word lines WL4, WL8, . . . ). In the second pre-fill operation loop, the selected word line voltage VSWL (as shown in FIG. 3A and FIG. 3B) is applied to the second word line group (the word lines WL4, WL8, . . . ) while the unselected word line voltage VUWL (as shown in FIG. 3A and FIG. 3B) is applied to the first word line group (the word lines WL1 to WL3, WL5 to WL7, . . . ). Of course, the application is not limited by this.

Alternatively, in the second embodiment, The case that i=3 and j=2 is taken as an example. Among the word lines WL1 to WLN, the word lines WL1 to WL3 are in one of the first word line sub-groups of the first word line group; the word lines WL4 and WL5 are in one of the second word line sub-groups of the second word line group; the word lines WL6 to WL8 are in one of the first word line sub-groups of the first word line group; the word lines WL9 and WL10 are in one of the second word line sub-groups of the second word line group; and so on. Thus, in the first pre-fill operation loop, the selected word line voltage VSWL (as shown in FIG. 3A and FIG. 3B) is applied to the first word line group (the word lines WL1 to WL3, WL6 to WL8, . . . ) while the unselected word line voltage VUWL (as shown in FIG. 3A and FIG. 3B) is applied to the second word line group (the word lines WL4, WL5, WL9, WL10, . . . ). In the second pre-fill operation loop, the selected word line voltage VSWL (as shown in FIG. 3A and FIG. 3B) is applied to the second word line group (the word lines WL4, WL5, WL9, WL10, . . . ) while the unselected word line voltage VUWL (as shown in FIG. 3A and FIG. 3B) is applied to the first word line group (the word lines WL1 to WL3, WL6 to WL8, . . . ). Of course, the application is not limited by this.

In possible variation example of the second embodiment, in the first pre-fill operation loop, the selected word line voltage VSWL is applied to the second word line group while the unselected word line voltage VUWL is applied to the first word line group. In the second pre-fill operation loop, the selected word line voltage VSWL is applied to the first word line group while the unselected word line voltage VUWL is applied to the second word line group. This is also within the spirit and the scope of the application.

From the above, in the second embodiment, two loops are needed for completing the pre-fill operation.

Third Embodiment

The word lines WI1 to WLN are divided into the selected word line group and the unselected word line group. The selected word line group includes adjacent continuous k (k being a positive integer) word lines while the unselected word line group includes the other (N-k) word lines. Further, in each pre-fill operation loop, different word lines are selected.

For understanding, k=2 is taken as an example but the application is not limited by. FIG. 6A to FIG. 6D show pre-fill operation loops according to the third embodiment of the application. Refer to FIG. 6A to FIG. 6D. In the third embodiment, in the first pre-fill operation loop, the word lines WL1 and WL2 are selected as the selected word line group while the other word lines WL3 to WLN are selected as the unselected word line group; in the second pre-fill operation loop, the word lines WL3 and WL4 are selected as the selected word line group while the other word lines WL1, WL2 and WL5 to WLN are selected as the unselected word line group; in the third pre-fill operation loop, the word lines WL5 and WL6 are selected as the selected word line group while the other word lines WL1 to WL4 and WL7 to WLN are selected as the unselected word line group; and in the (N/2)-th pre-fill operation loop, the word lines WL(N-1) and WLN are selected as the selected word line group while the other word lines WI1 to WL(N-2) are selected as the unselected word line group. In the first pre-fill operation loop, the selected word line voltage VSWL (as shown in FIG. 3A or FIG. 3B) is applied to the selected word line group (the word lines WL1 and WL2) while the unselected word line voltage VUWL (as shown in FIG. 3A or FIG. 3B) is applied to the unselected word line group (the other word lines WL3 to WLN); in the second pre-fill operation loop, the selected word line voltage VSWL (as shown in FIG. 3A or FIG. 3B) is applied to the selected word line group (the word lines WL3 and WL4) while the unselected word line voltage VUWL (as shown in FIG. 3A or FIG. 3B) is applied to the unselected word line group (the other word lines WL1, WL2 and WL5 to WLN); in the third pre-fill operation loop, the selected word line voltage VSWL (as shown in FIG. 3A or FIG. 3B) is applied to the selected word line group (the word lines WL5 and WL6) while the unselected word line voltage VUWL (as shown in FIG. 3A or FIG. 3B) is applied to the unselected word line group (the other word lines WL1 to WL4 and WL7 to WLN); and in the (N/2)-th pre-fill operation loop, the selected word line voltage VSWL (as shown in FIG. 3A or FIG. 3B) is applied to the selected word line group (the word lines WL(N-1) and WLN) while the unselected word line voltage VUWL (as shown in FIG. 3A or FIG. 3B) is applied to the unselected word line group (the other word lines WL1 to WL(N-2)). Of course, the application is not limited by this.

Alternatively, in possible variable example (k=3) of the third embodiment, in the first pre-fill operation loop, the word lines WL1 to WL3 are selected as the selected word line group while the other word lines WL4 to WLN are selected as the unselected word line group; in the second pre-fill operation loop, the word lines WL4 to WL6 are selected as the selected word line group while the other word lines WL1 to WL3 and WL7 to WLN are selected as the unselected word line group; in the third pre-fill operation loop, the word lines WL7 to WL9 are selected as the selected word line group while the other word lines WL1 to WL6 and WL10 to WLN are selected as the unselected word line group; and in the (N/3)-th pre-fill operation loop, the word lines WL(N-2) to WLN are selected as the selected word line group while the other word lines WL1 to WL(N-3) are selected as the unselected word line group. In the first pre-fill operation loop, the selected word line voltage VSWL (as shown in FIG. 3A or FIG. 3B) is applied to the selected word line group (the word lines WL1 to WL3) while the unselected word line voltage VUWL (as shown in FIG. 3A or FIG. 3B) is applied to the unselected word line group (the other word lines WL4 to WLN); in the second pre-fill operation loop, the selected word line voltage VSWL (as shown in FIG. 3A or FIG. 3B) is applied to the selected word line group (the word lines WL4 to WL6) while the unselected word line voltage VUWL (as shown in FIG. 3A or FIG. 3B) is applied to the unselected word line group (the other word lines WL1 to WL3 and WL7 to WLN); in the third pre-fill operation loop, the selected word line voltage VSWL (as shown in FIG. 3A or FIG. 3B) is applied to the selected word line group (the word lines WL7 to WL9) while the unselected word line voltage VUWL (as shown in FIG. 3A or FIG. 3B) is applied to the unselected word line group (the other word lines WL1 to WL6 and WL10 to WLN); and in the (N/3)-th pre-fill operation loop, the selected word line voltage VSWL (as shown in FIG. 3A or FIG. 3B) is applied to the selected word line group (the word lines WL(N-2) to WLN) while the unselected word line voltage VUWL (as shown in FIG. 3A or FIG. 3B) is applied to the unselected word line group (the other word lines WI1 to WL(N−3)). Of course, the application is not limited by this.

Figure 7A:
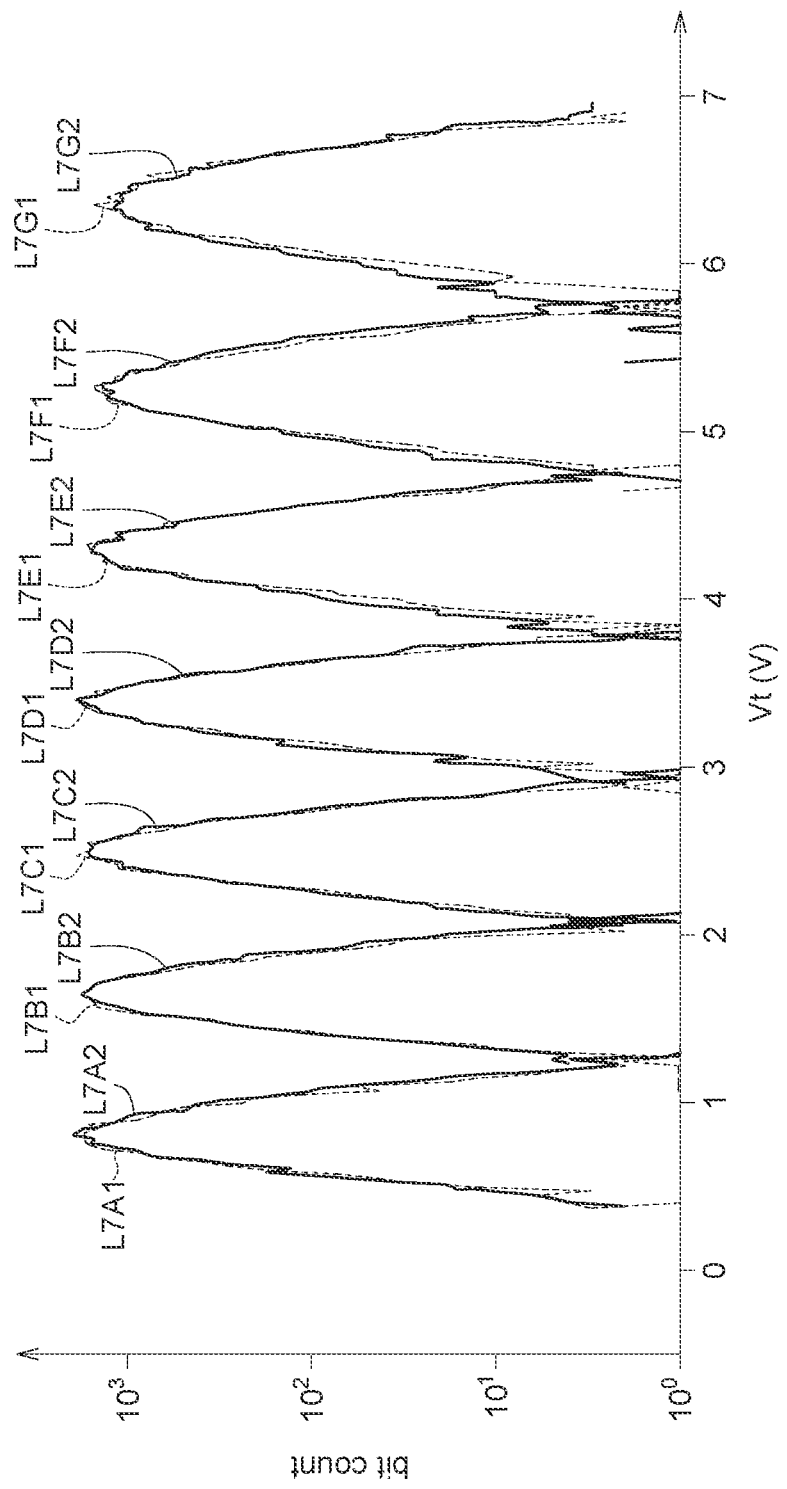
FIG. 7A shows a short-term threshold voltage (Vt) spreading for comparing one embodiment and the prior art.

Now refer FIG. 7A which shows a short-term threshold voltage (Vt) spreading for comparing one embodiment and the prior art. In FIG. 7A, the curves L7A1 to L7G1 refer to the short-term threshold voltage spreading of the memory device applying the embodiment of the application at state A to state G, respectively; while the curves L7A2 to L7G2 refer to the short-term threshold voltage spreading of the prior memory device (without applying the embodiment of the application) at state A to state G, respectively.

Figure 7B:
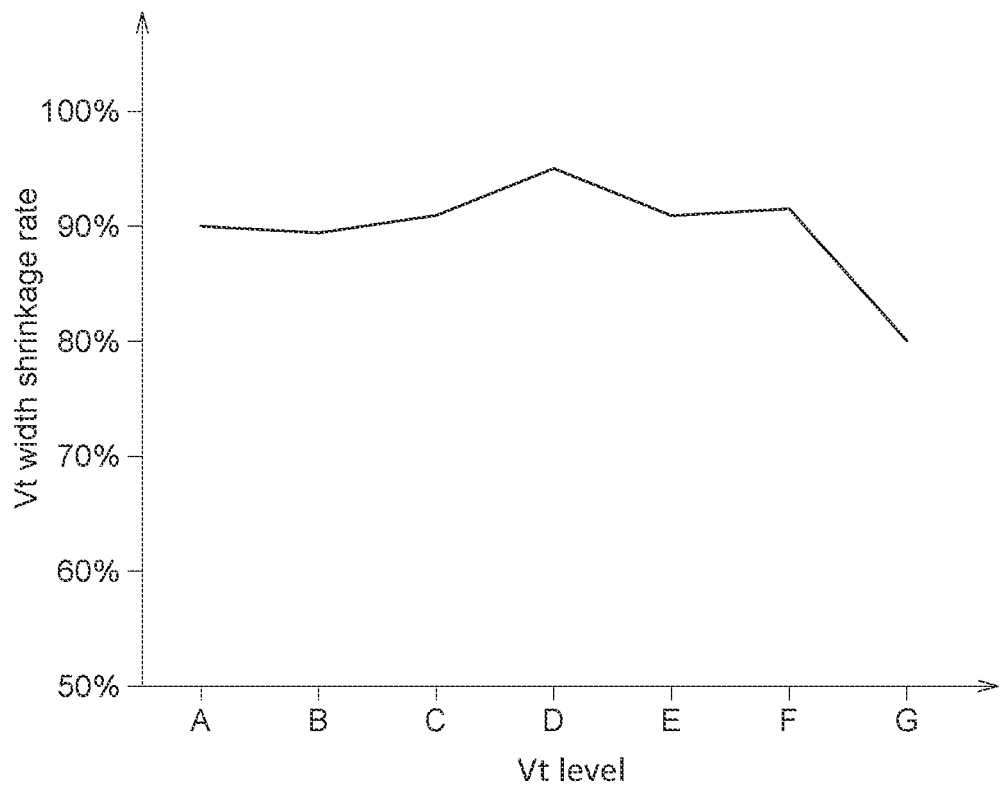
FIG. 7B shows Vt width shrinkage rate.

Now refer to FIG. 7B which shows Vt width shrinkage rate, wherein the horizontal axis is marked by state A to state G while the vertical axis shows the Vt width shrinkage rate at state A to state G. In here, the Vt width shrinkage rate is defined by a ratio of the short-term Vt distribution width of the memory device applying one embodiment and the short-term Vt distribution width of the prior memory device (without applying one embodiment) at state A to state G, respectively. For example, at state A, the short-term Vt distribution width of the memory device applying one embodiment is about 0.45V~0.7V and the short-term Vt distribution width of the prior memory device (without applying one embodiment) is about 0.5V~1V. Thus, the Vt width shrinkage rate is about 0.7~0.9.

From FIG. 7A and FIG. 7B, in one embodiment of the application, the short-term threshold voltage spreading is effectively reduced (the shrink rate is about 10% or above).

Figure 8A:
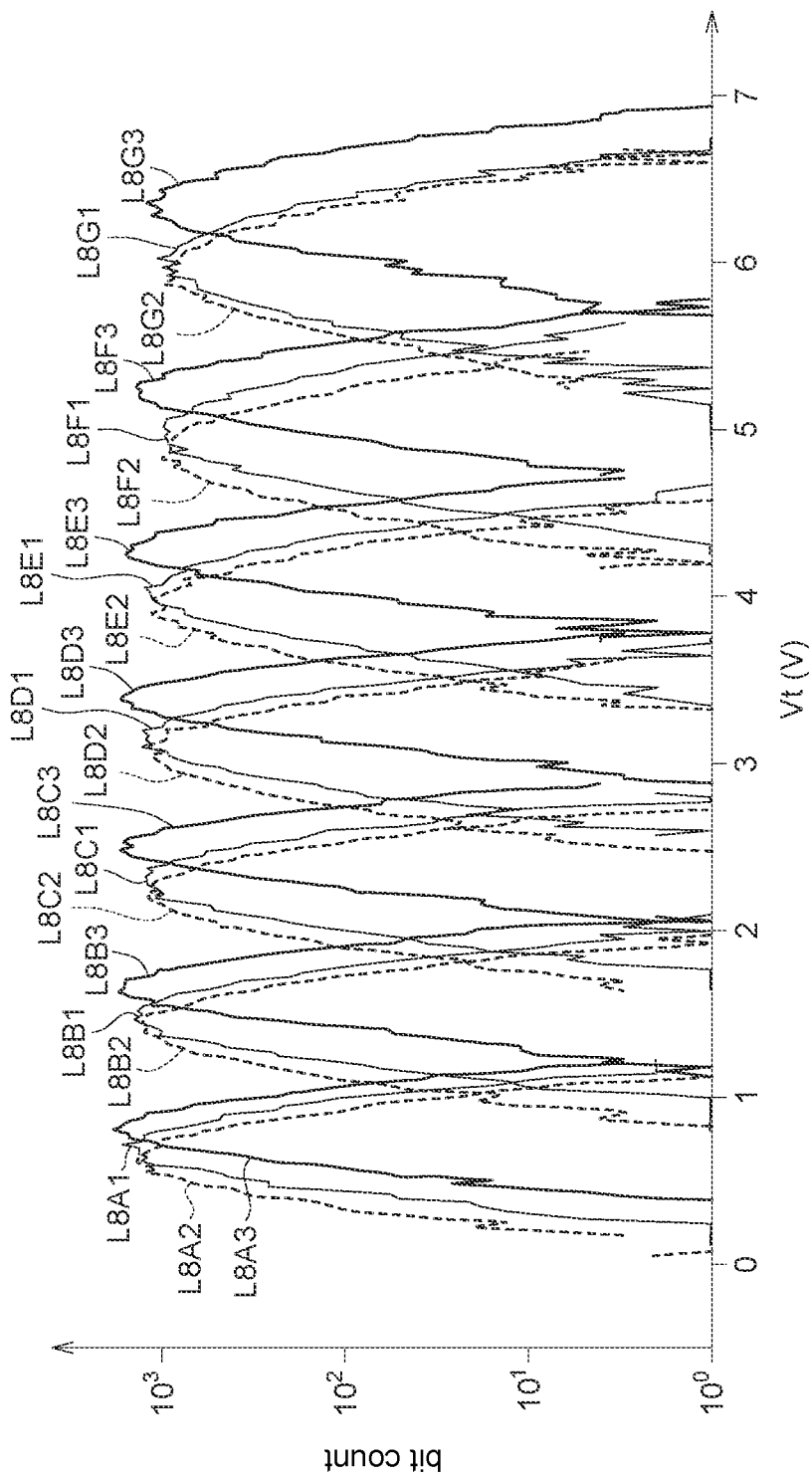
FIG. 8A shows a high-temperature long-term Vt spreading for comparing one embodiment and the prior art.

Now refer to FIG. 8A which shows a high-temperature long-term Vt spreading for comparing one embodiment and the prior art. In FIG. 8A, the curves L8A1 to L8G1 refer to the high-temperature long-term threshold voltage spreading of the memory device applying the embodiment of the application at state A to state G, respectively (the high-temperature long-term referring to that the Vt spread curve is measured at high temperature at long term after the memory device is programmed); the curves L8A2 to L8G2 refer to the high-temperature long-term threshold voltage spreading of the prior memory device (without applying the embodiment of the application) at state A to state G, respectively; while the curves L8A3 to L8G3 refer to the threshold voltage spreading of the prior memory device (without applying the embodiment of the application) immediately after the memory device is programmed at state A to state G, respectively.

Figure 8B:
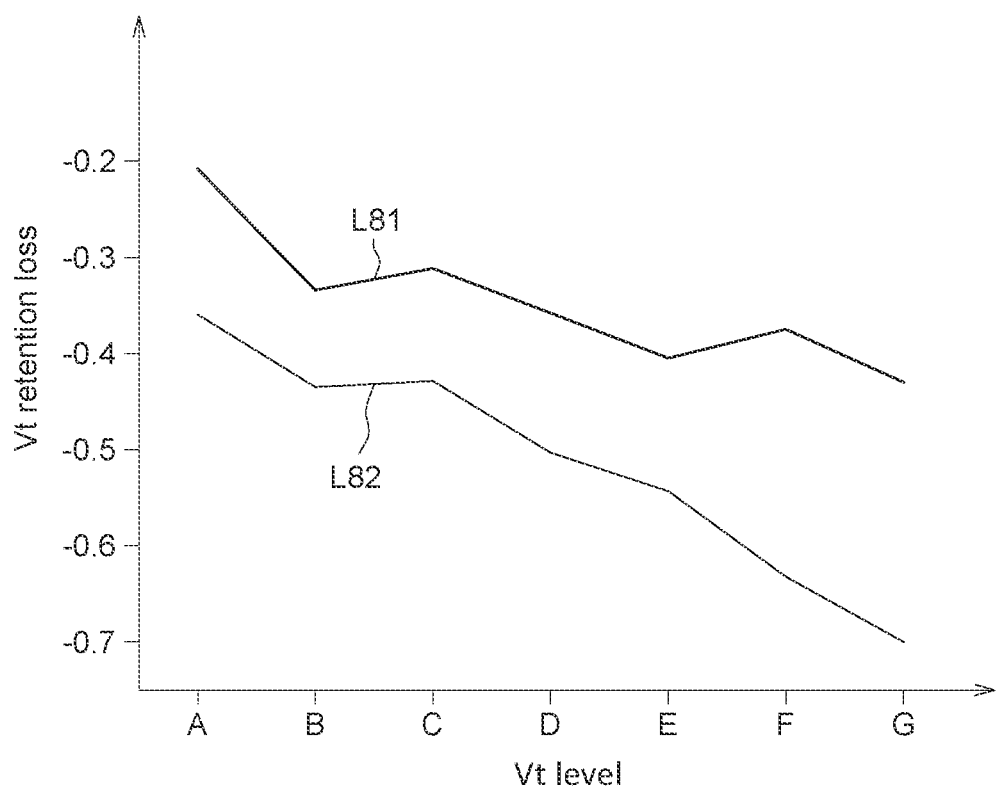
FIG. 8B shows low bound Vt retention loss.

Now refer to FIG. 8B which shows low bound Vt retention loss. The horizontal axis is marked by the state A to the state G.

The curve L81 is obtained by subtracting values of the curves L8A1 to L8G1 by values of the curves L8A3 to L8G3 while the curve L82 is obtained by subtracting values of the curves L8A2 to L8G2 by values of the curves L8A3 to L8G3. Values of the curve L81 at state A to state G are summed into −2.7V while values of the curve L82 at state A to state G are summed into −3.6V. Thus, the embodiment of the application has gained window improvement about 0.9V (−2.7V−3.6V=0.9V).

From FIG. 8A and FIG. 8B, one embodiment of the application effectively shrinks the high-temperature long-term Vt distribution.

In one embodiment of the application, by applying the selected word line voltage and the unselected word line voltage, the channel potential is highly boosted and thus hot carrier is generated to fill the space region. Further, the carrier-filled space region is effectively in suppressing Vt spreading caused by fast charge lateral movement and tightening Vt distribution. Further, the carrier-filled space region is effectively in retarding the long-term charge lateral movement and improving retention loss.

Still further, in one embodiment of the application, one pre-fill operation loop is completed in about several hundred micro-seconds and the operation speed is about ten times to prior art (requiring several milliseconds).

One embodiment of the application is applied to 3D flash memory, for example but not limited by, vertical channel type 3D flash memories, vertical gate type 3D flash memories, charge trapping type 3D flash memories or floating gate type 3D flash memories.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operation method of a memory device including a plurality of word lines, the operation method comprising:
performing a pre-fill operation on the word lines, in a first loop, applying a selected word line voltage on a first selected word line group of the word lines and applying an unselected word line voltage on a first unselected word line group of the word lines, and in a second loop, applying the selected word line voltage on a second selected word line group of the word lines and applying the unselected word line voltage on a second unselected word line group of the word lines, the first selected word line group being different from the second selected word line group, and the first unselected word line group being different from the second unselected word line group;
performing an erase operation on the word lines; and
performing a programming operation on the word lines.

2. The operation method according to claim 1, wherein
in an unselected word line pre-on phase of the first loop, the selected word line voltage is transited to a first selected word line voltage and the unselected word line voltage is transited to a logic high level; and
in a pre-fill phase of the first loop, the selected word line voltage is transited from the first selected word line voltage to a second selected word line voltage and the unselected word line voltage is kept at the logic high level.

3. The operation method according to claim 2, wherein the first selected word line voltage is higher than 0V but lower than the second selected word line voltage.

4. The operation method according to claim 3, wherein the second selected word line voltage is equal to a programming voltage; and the logic high level of the unselected word line voltage is about a difference value between the programming voltage and a first predetermined voltage.

5. The operation method according to claim 1, wherein
in an unselected word line pre-on phase of the first loop, the selected word line voltage is kept at a logic low level and the unselected word line voltage is transited to a first unselected word line voltage; and
in a pre-fill phase of the first loop, the selected word line voltage is transited to a logic high level and the unselected word line voltage is transited from the first unselected word line voltage to a second unselected word line voltage, wherein the unselected word line pre-on phase and the pre-fill phase are partially overlapped.

6. The operation method according to claim 5, wherein the first unselected word line voltage is higher than 0V but lower than the second unselected word line voltage.

7. The operation method according to claim 6, wherein the second unselected word line voltage is about a difference value between a programming voltage and a first predetermined voltage.

8. The operation method according to claim 1, wherein the word lines includes an odd word line group and an even word line group, the first selected word line group includes any one of the odd word line group and the even word line group, and the second selected word line group includes the other one of the odd word line group and the even word line group.

9. The operation method according to claim 1, wherein
the word lines includes a first word line group and a second word line group, the first word line group includes a plurality of first word line sub-groups each including adjacent continuous "i" ("i" being a positive integer) word line(s) while the second word line group includes a plurality of second word line sub-groups each including adjacent continuous "j" ("j" being a positive integer) word line(s), the first word line sub-groups and the second word line sub-groups are interleaving to each other; and
the first selected word line group includes any one of the first word line group and the second word line group while the first unselected word line group includes the other one of the first word line group and the second word line group.

10. The operation method according to claim 1, wherein the word lines are "N" word lines ("N" being a positive integer), the first selected word line group includes "k" ("k" being a positive integer) adjacent continuous word line(s) and the second word line group includes the other "N−k" word line(s).

11. A memory device including:
a controller; and
a memory array coupled to the controller, the memory array including a plurality of word lines,
wherein the controller is configured for:
performing a pre-fill operation on the word lines, in a first loop, applying a selected word line voltage on a first selected word line group of the word lines and applying an unselected word line voltage on a first unselected word line group of the word lines, and in a second loop, applying the selected word line voltage on a second selected word line group of the word lines and applying the unselected word line voltage on a second unselected word line group of the word lines, the first selected word line group being different from the second selected word line group, and the first unselected word line group being different from the second unselected word line group;
performing an erase operation on the word lines; and
performing a programming operation on the word lines.

12. The memory array according to claim 11, wherein
in an unselected word line pre-on phase of the first loop, the selected word line voltage is transited to a first selected word line voltage and the unselected word line voltage is transited to a logic high level; and
in a pre-fill phase of the first loop, the selected word line voltage is transited from the first selected word line voltage to a second selected word line voltage and the unselected word line voltage is kept at the logic high level.

13. The memory array according to claim 12, wherein the first selected word line voltage is higher than 0V but lower than the second selected word line voltage.

14. The memory array according to claim 13, wherein the second selected word line voltage is equal to a programming voltage; and the logic high level of the unselected word line voltage is about a difference value between the programming voltage and a first predetermined voltage.

15. The memory array according to claim 11, wherein
in an unselected word line pre-on phase of the first loop, the selected word line voltage is kept at a logic low level and the unselected word line voltage is transited to a first unselected word line voltage; and
in a pre-fill phase of the first loop, the selected word line voltage is transited to a logic high level and the unselected word line voltage is transited from the first unselected word line voltage to a second unselected word line voltage, wherein the unselected word line pre-on phase and the pre-fill phase are partially overlapped.

16. The memory array according to claim 15, wherein the first unselected word line voltage is higher than 0V but lower than the second unselected word line voltage.

17. The memory array according to claim 16, wherein the second unselected word line voltage is about a difference value between a programming voltage and a first predetermined voltage.

18. The memory array according to claim 11, wherein the word lines includes an odd word line group and an even word line group, the first selected word line group includes any one of the odd word line group and the even word line group, and the second selected word line group includes the other one of the odd word line group and the even word line group.

19. The memory array according to claim 11, wherein
the word lines includes a first word line group and a second word line group, the first word line group includes a plurality of first word line sub-groups each including adjacent continuous "i" ("i" being a positive integer) word line(s) while the second word line group includes a plurality of second word line sub-groups each including adjacent continuous "j" ("j" being a positive integer) word line(s), the first word line sub-groups and the second word line sub-groups are interleaving to each other; and
the first selected word line group includes any one of the first word line group and the second word line group while the first unselected word line group includes the other one of the first word line group and the second word line group.

20. The memory array according to claim 11, wherein the word lines are "N" word lines ("N" being a positive integer), the first selected word line group includes "k" ("k" being a positive integer) adjacent continuous word line(s) and the second word line group includes the other "N−k" word line(s).

* * * * *